(12) United States Patent
Bennett

(10) Patent No.: US 8,390,367 B1
(45) Date of Patent: Mar. 5, 2013

(54) ENSURING MINIMUM GATE SPEED DURING STARTUP OF GATE SPEED REGULATOR

(75) Inventor: George J. Bennett, Murrieta, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 76 days.

(21) Appl. No.: 13/027,504

(22) Filed: Feb. 15, 2011

(51) Int. Cl.
*H03L 7/06* (2006.01)
*G05F 3/02* (2006.01)

(52) U.S. Cl. ......... 327/538; 327/544; 327/158; 327/149

(58) Field of Classification Search .................. None
See application file for complete search history.

(56) References Cited

U.S. PATENT DOCUMENTS

| | | | | |
|---|---|---|---|---|
| 5,039,893 | A | * | 8/1991 | Tomisawa ..................... 327/276 |
| 5,216,302 | A | * | 6/1993 | Tanizawa ..................... 327/157 |
| 5,719,514 | A | * | 2/1998 | Sato ............................. 327/262 |
| 5,811,983 | A | | 9/1998 | Lundberg |
| 5,812,031 | A | | 9/1998 | Saotome et al. |
| 6,157,231 | A | * | 12/2000 | Wasson ........................ 327/156 |
| 6,157,247 | A | * | 12/2000 | Abdesselem et al. ......... 327/540 |
| 6,259,293 | B1 | * | 7/2001 | Hayase et al. ................ 327/276 |
| 6,333,652 | B1 | * | 12/2001 | Iida et al. ..................... 327/161 |
| 6,535,735 | B2 | | 3/2003 | Underbrink et al. |
| 6,870,410 | B1 | | 3/2005 | Doyle et al. |
| 6,930,521 | B2 | * | 8/2005 | Wald ............................. 327/147 |
| 7,071,710 | B2 | | 7/2006 | Marshall et al. |
| 7,129,763 | B1 | * | 10/2006 | Bennett et al. ................ 327/262 |
| 7,148,755 | B2 | * | 12/2006 | Naffziger et al. ............... 331/16 |
| 7,205,805 | B1 | * | 4/2007 | Bennett ........................ 327/158 |
| 7,330,019 | B1 | | 2/2008 | Bennett |
| 7,486,060 | B1 | | 2/2009 | Bennett |
| 7,489,204 | B2 | | 2/2009 | Habitz et al. |
| 7,659,126 | B1 | | 2/2010 | Smith et al. |
| 7,733,189 | B1 | | 6/2010 | Bennett |
| 7,733,489 | B2 | * | 6/2010 | Ding ............................ 356/416 |
| 8,324,974 | B1 | | 12/2012 | Bennett |
| 2005/0218871 | A1 | | 10/2005 | Kang et al. |

OTHER PUBLICATIONS

Feng Luo, et al., "Integrated Adaptive Step-Up/Down Switching DC-DC Converter with Tri-Band Tri-Mode Digital Control for Dynamic Voltage Scaling", IEEE International Symposium on Industrial Electronics (ISIE08), pp. 142-147, Jun. 2008.

Zarrabi, et al., "An Interconnect-Aware Delay Model for Dynamic Voltage Scaling in nm Technologies", Proceedings of the 19th ACM Great Lakes Symposium on VLSI 2009, Boston Area, MA, USA, pp. 45-50.

* cited by examiner

Primary Examiner — Tuan T Lam

(57) ABSTRACT

A computing device is disclosed comprising digital circuitry, and a gate speed regulator operable to generate a supply voltage applied to the digital circuitry. A frequency synthesizer generates a first reference frequency, and a propagation delay oscillator generates a first oscillation frequency in response to the supply voltage, wherein the first oscillation frequency is compared to the first reference frequency to generate a first error signal. A reference oscillator generates a second reference frequency in response to a reference voltage, and a startup oscillator generates a second oscillation frequency in response to the supply voltage, wherein the second oscillation frequency is compared to the second reference frequency to generate a second error signal. An adjustable circuit, responsive to the first and second error signals, adjusts the supply voltage applied to the digital circuitry.

16 Claims, 6 Drawing Sheets

ENSURING MINIMUM GATE SPEED DURING STARTUP OF GATE SPEED REGULATOR

BACKGROUND

Regulating power consumption of digital circuitry has become an important consideration in designing computing and consumer devices such as desktop and laptop computers, televisions, audio equipment, smartphones, cameras, etc. In portable devices, regulating power consumption helps increase the life of battery power, and in general, regulating power consumption helps reduce operating costs, particularly for large enterprise companies that may continuously operate hundreds or even thousands of computing and storage devices.

FIG. 1A illustrates a prior art gate speed regulator for regulating power consumption of digital circuitry 2. A propagation delay oscillator 4 generates a propagation delay frequency 6 representing a propagation delay of the digital circuitry 2. A frequency synthesizer 8 generates a reference frequency 10 and a frequency comparator 12 generates a frequency error 14 representing a difference between the reference frequency 10 and the propagation delay frequency 6. An adjustable circuit 16, responsive to the frequency error 14, adjusts at least one of a supply voltage and a clocking frequency 18 applied to the digital circuitry 2 in order to maintain a target performance and/or a target power consumption.

For example, if the frequency error 14 indicates the propagation delay frequency 6 has fallen bellow a threshold, the adjustable circuit 16 may increase the supply voltage to the digital circuitry to maintain error free operation and performance by maintaining a target propagation delay. Alternatively, the adjustable circuit 16 may decrease the clocking frequency applied to the digital circuitry to maintain error free operation at a lower performance while decreasing the power consumption.

The propagation delay frequency 6 of FIG. 1A may be generated by a ring oscillator shown in FIG. 1B which comprises a plurality of inverters $20_0$-$20_N$ connected in a ring configuration and an NAND gate 22 for enabling the ring oscillator in response to an enable signal 24. The output frequency of the ring oscillator depends on the number of inverters $20_0$-$20_N$, the amplitude of the supply voltage 18, and other factors, such as variations in fabrication process, ambient temperature, etc.

DETAILED DESCRIPTION OF EMBODIMENTS OF THE INVENTION

Figure 1A:
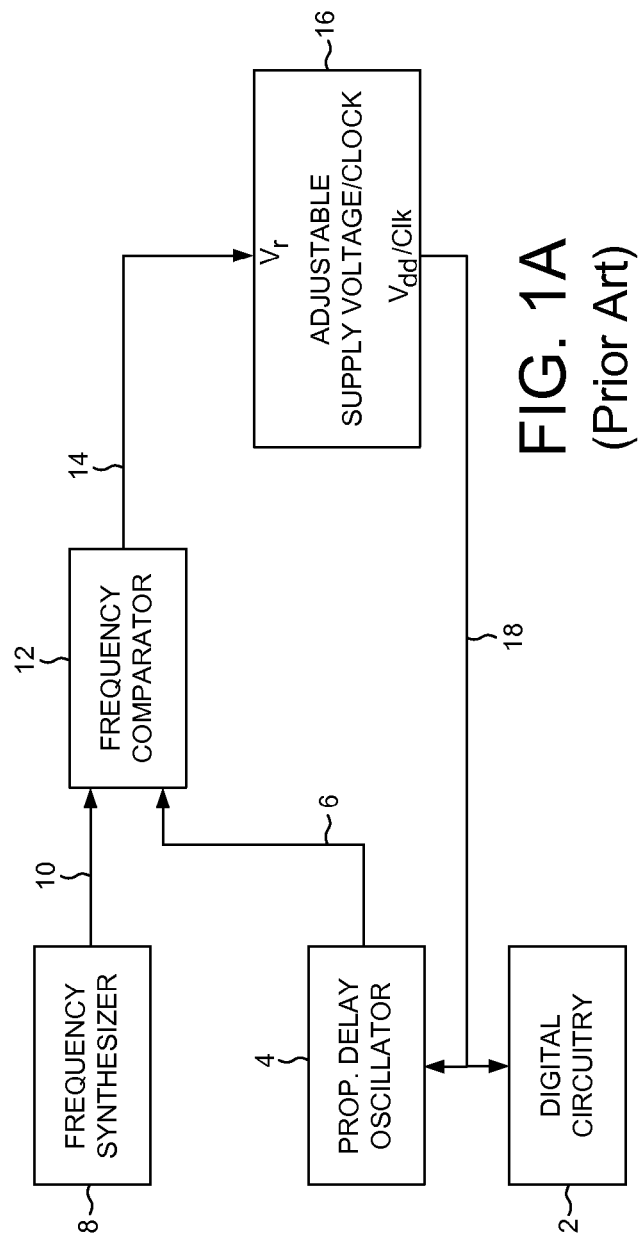
FIG. 1A shows a prior art computing device comprising digital circuitry and a gate speed regulator for regulating power consumption of the digital circuitry.
Figure 1B:
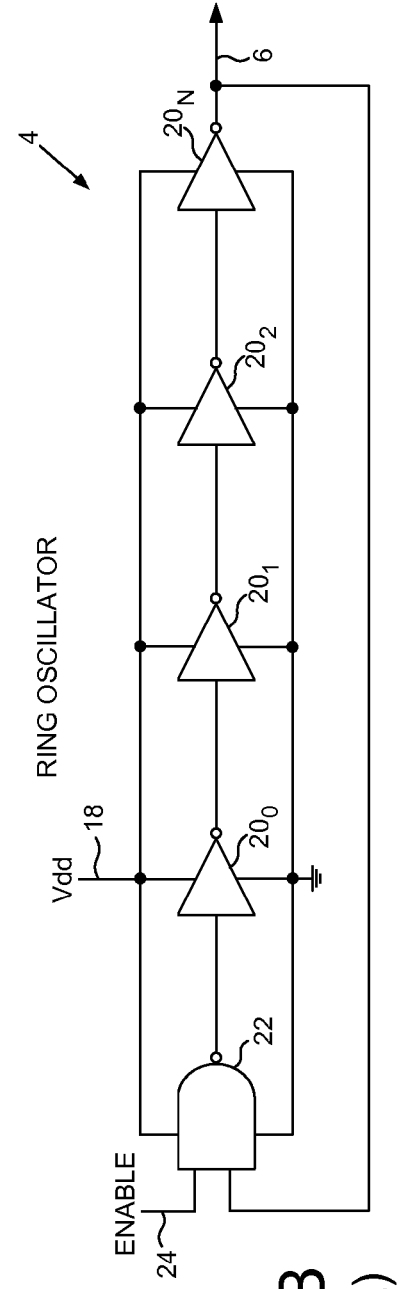
FIG. 1B shows a prior art ring oscillator for generating a propagation delay frequency representing a propagation delay of the digital circuitry.
Figure 2:
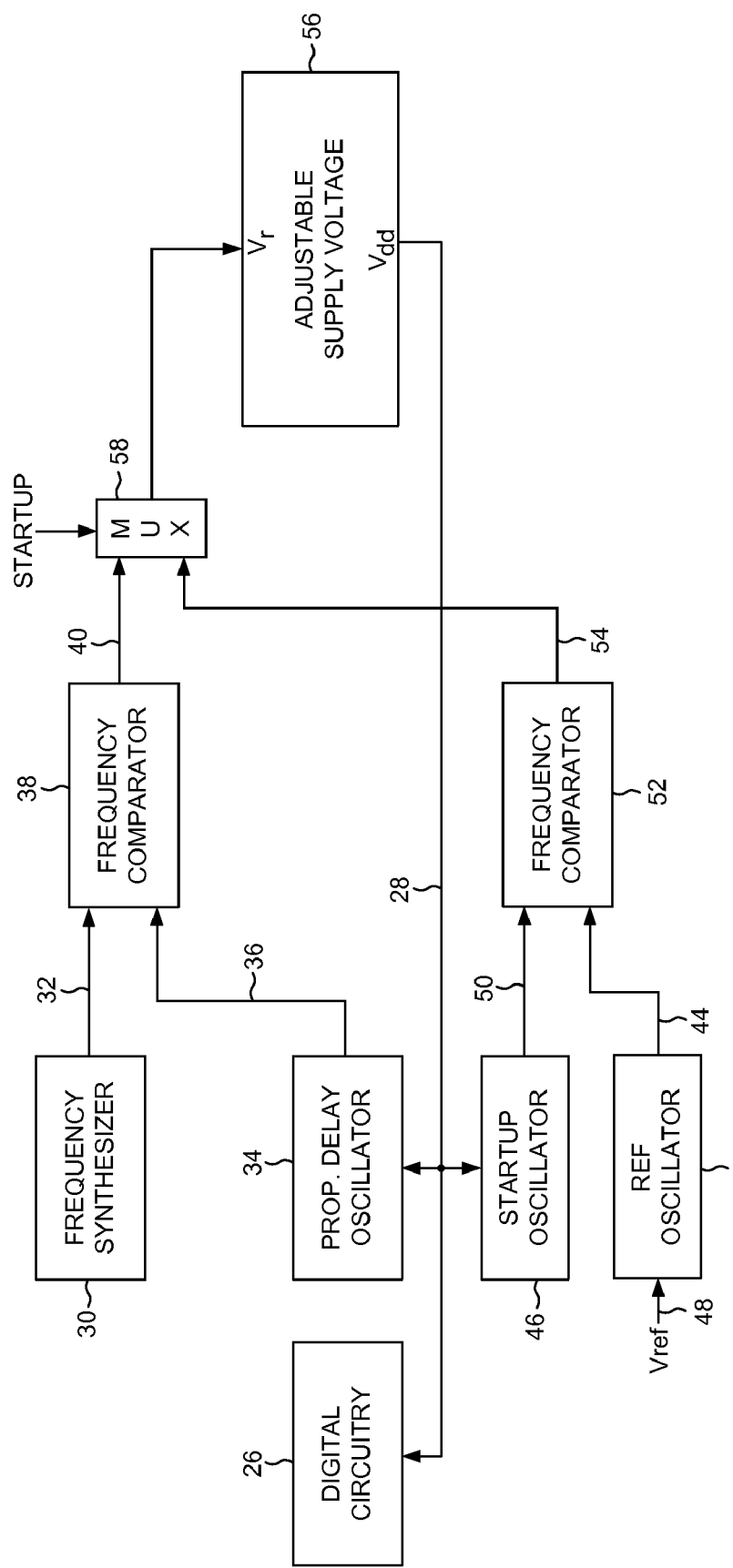
FIG. 2 shows a computing device according to an embodiment of the present invention comprising a reference oscillator and a startup oscillator used to startup a gate speed regulator for regulating a power consumption of digital circuitry.

FIG. 2 shows a computing device comprising digital circuitry 26, and a gate speed regulator operable to generate a supply voltage 28 applied to the digital circuitry 26. A frequency synthesizer 30 generates a first reference frequency 32, and a propagation delay oscillator 34 generates a first oscillation frequency 36 in response to the supply voltage 28, wherein the first oscillation frequency 36 is compared 38 to the first reference frequency 32 to generate a first error signal 40. A reference oscillator 42 generates a second reference frequency 44 in response to a reference voltage 48, and a startup oscillator 46 generates a second oscillation frequency 50 in response to the supply voltage 28, wherein the second oscillation frequency 50 is compared 52 to the second reference frequency 44 to generate a second error signal 54. An adjustable circuit 56, responsive to the first and second error signals 40 and 54, adjusts the supply voltage 28 applied to the digital circuitry 26.

In one embodiment, during a startup interval of the computing device the second error signal 54 generated by comparing the output of the startup oscillator 46 to the output of the reference oscillator 42 is used to adjust the supply voltage 28 which allows the frequency synthesizer 30 to stabilize while ensuring a minimum gate speed for the digital circuitry 26. Accordingly, a multiplexer 58 selects the second error signal 54 during the startup interval, and selects the first error signal 40 at the end of the startup interval. Any suitable technique may be employed to generate the reference voltage 48 applied to the reference oscillator 42, such as with a low power analog voltage regulator.

Figure 3:
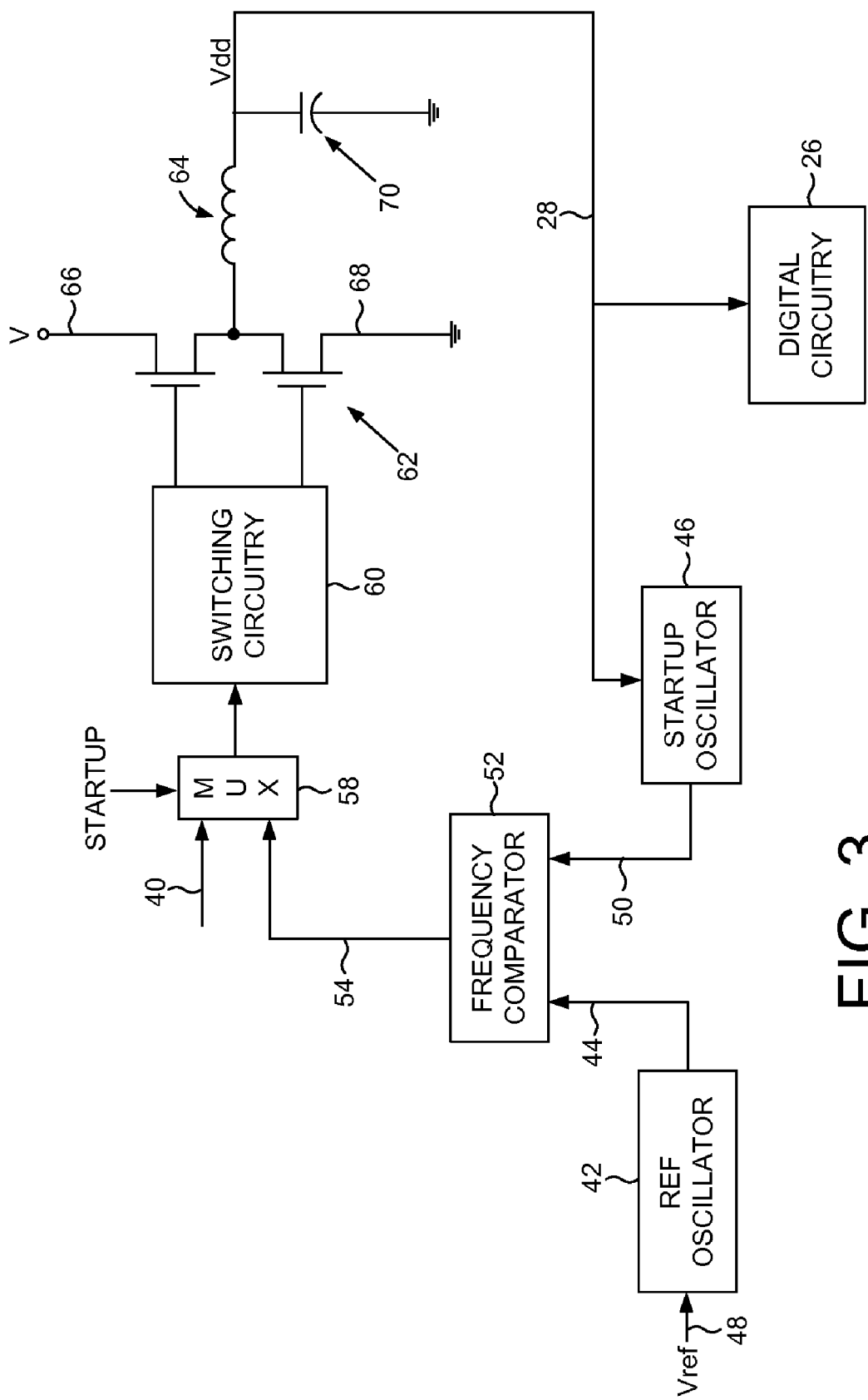
FIG. 3 shows an embodiment of the present invention wherein the gate speed regulator comprises switching circuitry and a charging element in the form of an inductor for implementing a switched-mode regulator.

Any suitable gate speed regulator configuration may be employed in the embodiments of the present invention. FIG. 3 shows an embodiment of the present invention wherein the gate speed regulator comprises a switched-mode regulator. Switching circuitry 60 controls the operation of switches 62 to charge a charging element 64 in response to the error signal 40 or 54. For example, during the startup interval when the error signal 54 exceeds a threshold, the switching circuitry 60 may periodically connect the charging element 64 to a charging voltage 66 and then to ground 68 (and optionally tristate) in order to adjust the supply voltage 28 generated across capacitor 70. Only the startup oscillator 46 and reference oscillator 42 are shown in FIG. 3 for clarity.

Figure 4:
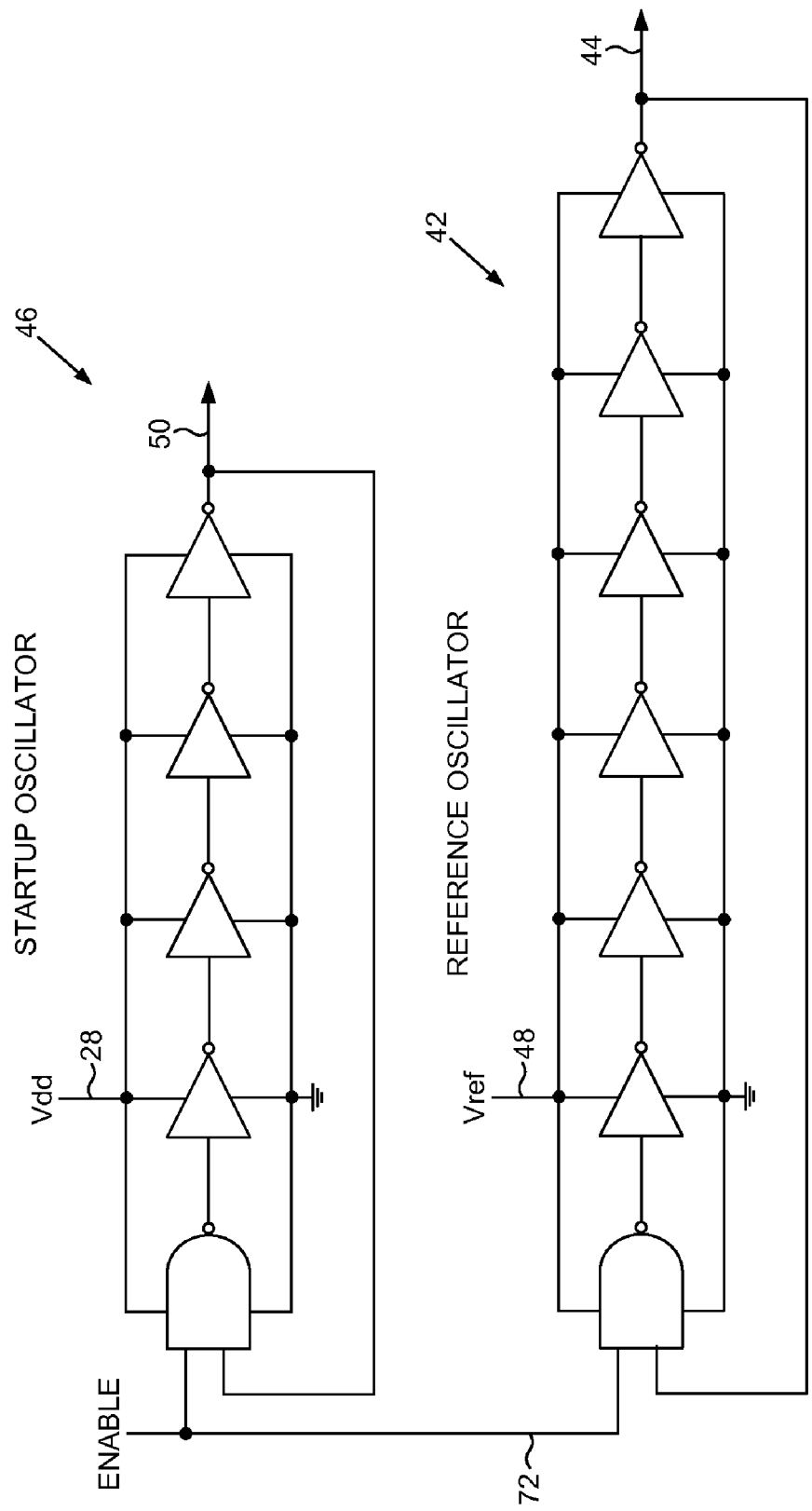
FIG. 4 shows an embodiment of the present invention wherein a length of the startup oscillator is shorter than a length of the reference oscillator so that the reference voltage is greater than the supply voltage during the startup interval.

In one embodiment, the reference oscillator 42 and the startup oscillator 46 are configured so that the supply voltage 28 is less than the reference voltage 48 during the startup interval, thereby tethering the supply voltage 28 to the reference voltage 48 by a tether voltage. Any suitable technique may be employed to implement the tether voltage, wherein in an embodiment shown in FIG. 4, a length of the startup oscillator 46 is shorter than a length of the reference oscillator 42 which ensures the supply voltage 28 is less than the reference voltage 48 by a tether voltage determined by a ratio of the lengths. That is, because the length of the startup oscillator 46 is shorter than the reference oscillator 42, it requires a lower supply voltage to match the oscillation frequency 50 output by the startup oscillator 42 to the reference frequency 44 output by the reference oscillator 42. In the embodiment of FIG. 4, an enable signal 72 synchronously enables both the startup oscillator 46 and the reference oscillator 42. In one embodiment, the enable signal 72 may remain active during the startup interval, and in another embodiment, the enable signal 72 may periodically reset both oscillators (e.g., after a predetermined number of oscillations) depending on how the frequency comparator 52 is implemented.

Figure 5:
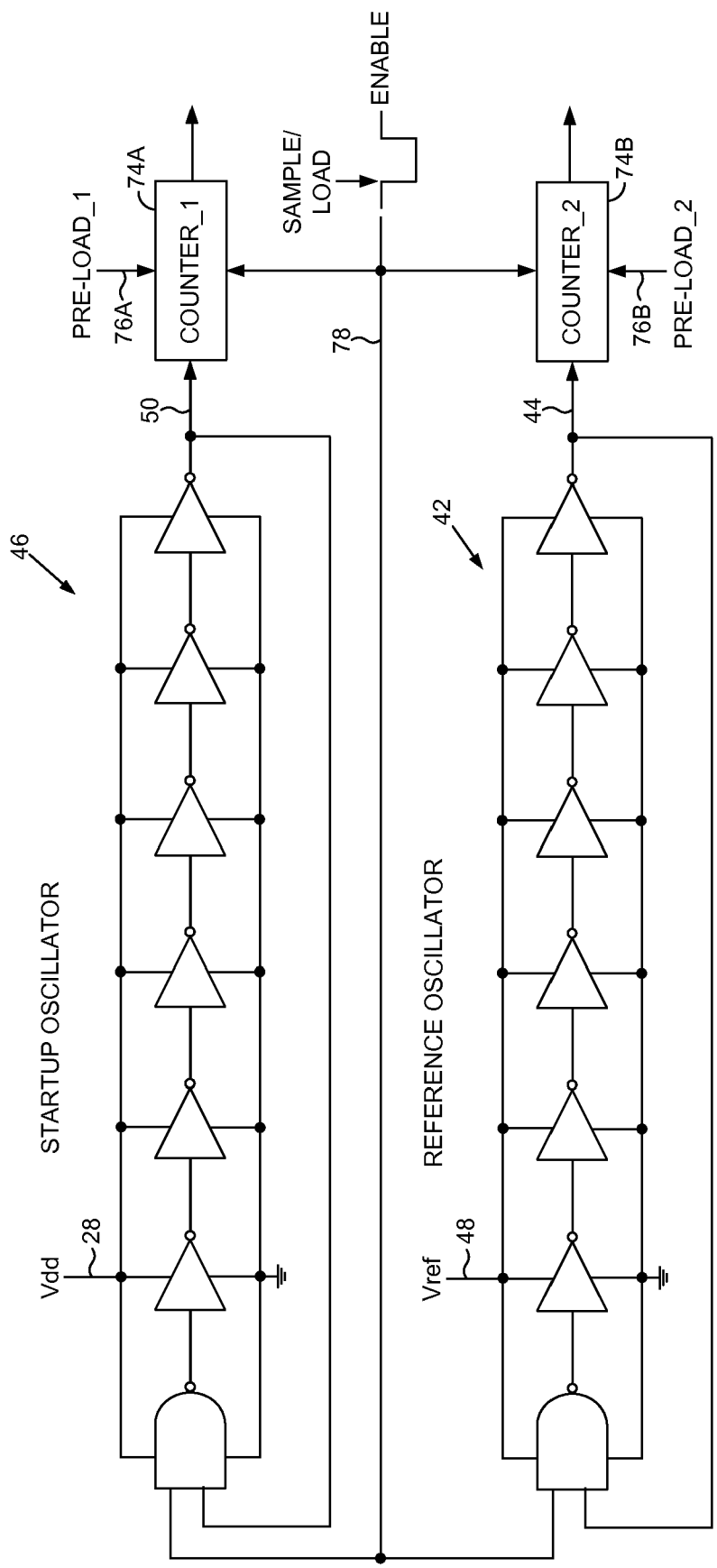
FIG. 5 shows an embodiment of the present invention wherein the startup oscillator and reference oscillator drive respective counters that are pre-loaded with different values so that the reference voltage is greater than the supply voltage during the startup interval.

FIG. 5 shows an alternative embodiment of the present invention for ensuring that the supply voltage 28 is below the reference voltage 48 by the tether voltage. In this embodiment, the lengths of the startup oscillator 46 and reference oscillator 42 are the same, but each oscillator drives a respective counter 74A and 74B. The first counter 74A is pre-loaded with a first value 76A and the second counter 74B is pre-loaded with a second value 76B, wherein after a predetermined interval the difference between the counters is evaluated to generate the error signal 54 used to adjust the supply voltage 28. For example, in one embodiment the first counter 74A may be pre-loaded with a non-zero offset and the second counter 74B pre-loaded with zero (no offset) and then both counters incremented. After a predetermined interval, the counters are sampled and the outputs compared. If the supply voltage 28 differs from the reference voltage 48 by the tether voltage, the counter outputs will match. Otherwise the supply voltage 28 is adjusted until the output of the counters match after a predetermined interval. In an alternative embodiment, the counters 74A and 74B may be pre-loaded with suitable values and then decremented for the predetermined interval.

In the embodiment of FIG. 5, a control signal 78 pre-loads the counters 74A and 74B and enables both oscillators 42 and 46 synchronously. After a predetermined interval, the control signal 78 disables both oscillators 42 and 46 and samples the output of the counters 74A and 74B in order to adjust the supply voltage 28. The control signal 78 then pre-loads the counters 74A and 74B and again enables both oscillators 42 and 46 for another interval. The control signal 78 may be generated in any suitable manner, and in one embodiment, the control signal 78 is generated by one of the first and second counters 74A and 74B (e.g., in response to a higher order bit in one of the counters). For example, a higher order bit of the second counter 74B may be used to generate the control signal 78 that is synchronous with the reference frequency 44 output by the reference oscillator 42.

Figure 6:
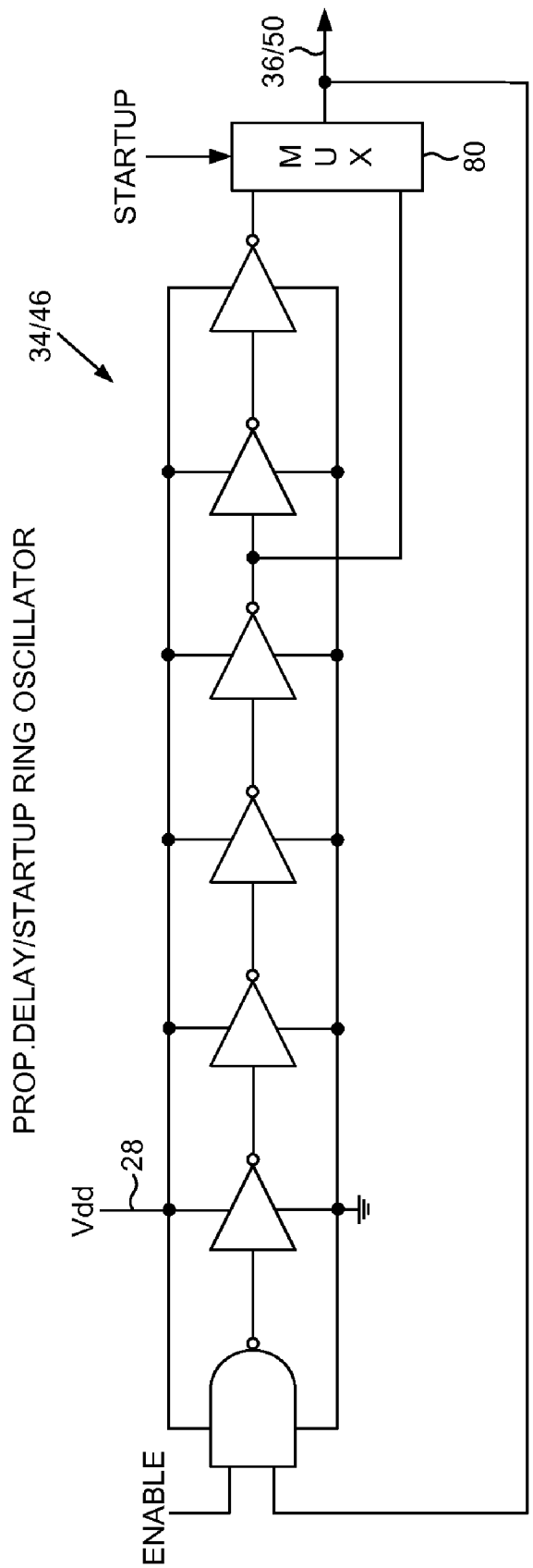
FIG. 6 shows an embodiment of the present invention wherein a single ring oscillator and multiplexer are used to implement the startup oscillator and a propagation delay oscillator.

FIG. 6 shows an embodiment of the present invention wherein the propagation delay oscillator 34 and the startup oscillator 46 share at least one inverting element in order to reduce the cost of the gate speed regulator. In the embodiment of FIG. 6, a number of inverting elements are connected together to form a ring oscillator, and a multiplexer 80 adjusts a length of the ring oscillator during and after the startup interval. For example, the multiplexer 80 may reduce of the length of the ring oscillator (by two inverting elements in the example shown) during the startup interval, thereby configuring the ring oscillator into the startup oscillator 46. At the end of the startup interval, the multiplexer may re-insert the two inverting elements in order to increase the length of the ring oscillator, thereby configuring the ring oscillator into the propagation delay oscillator 34 (FIG. 2).

What is claimed is:
1. A computing device comprising:
digital circuitry; and
a gate speed regulator operable to generate a supply voltage applied to the digital circuitry, the gate speed regulator comprising:
a frequency synthesizer operable to generate a first reference frequency;
a propagation delay oscillator operable to generate a first oscillation frequency in response to the supply voltage, wherein the first oscillation frequency is compared to the first reference frequency to generate a first error signal;
a reference oscillator operable to generate a second reference frequency in response to a reference voltage;
a startup oscillator operable to generate a second oscillation frequency in response to the supply voltage, wherein the second oscillation frequency is compared to the second reference frequency to generate a second error signal; and
an adjustable circuit, responsive to the first and second error signals, for adjusting the supply voltage applied to the digital circuitry.

2. The computing device as recited in claim 1, wherein:
the adjustable circuit is responsive to the second error signal during a startup interval; and
the adjustable circuit is responsive to the first error signal after the startup interval.

3. The computing device as recited in claim 2, wherein the startup interval allows the frequency synthesizer to stabilize.

4. The computing device as recited in claim 2, wherein the reference voltage is greater than the supply voltage during the startup interval.

5. The computing device as recited in claim 4, wherein:
the reference oscillator comprises a first ring oscillator comprising a first number of inverter elements; and
the startup oscillator comprises a second ring oscillator comprising a second number of inverter elements less than the first number of inverter elements.

6. The computing device as recited in claim 4, wherein:
the reference oscillator drives a first counter pre-loaded with a first value; and
the startup oscillator drives a second counter pre-loaded with a second value different than the first value.

7. The computing device as recited in claim 2, wherein the propagation delay oscillator and the startup oscillator share at least one inverter element.

8. The computing device as recited in claim 7, further comprising configuration circuitry operable to configure a plurality of inverter elements into the startup oscillator during the startup interval and operable to configure the plurality of inverter elements into the propagation delay oscillator after the startup interval.

9. A method of operating a computing device comprising digital circuitry, and a gate speed regulator operable to generate a supply voltage applied to the digital circuitry, the method comprising:
generating a first reference frequency;
generating a first oscillation frequency in response to the supply voltage, wherein the first oscillation frequency represents a propagation delay of the digital circuitry and the first oscillation frequency is compared to the first reference frequency to generate a first error signal;
generating a second reference frequency in response to a reference voltage;
generating a startup oscillation frequency in response to the supply voltage, wherein the startup oscillation frequency is compared to the second reference frequency to generate a second error signal; and adjusting the supply voltage applied to the digital circuitry in response to the first and second error signals.

10. The method as recited in claim 9, further comprising:
adjusting the supply voltage in response to the second error signal during a startup interval; and
adjusting the supply voltage in response to the first error signal after the startup interval.

11. The method as recited in claim 10, wherein the startup interval allows the frequency synthesizer to stabilize.

12. The method as recited in claim 10, wherein the reference voltage is greater than the supply voltage during the startup interval.

13. The method as recited in claim 12, wherein:
the second reference frequency is generated by a reference oscillator comprising a first ring oscillator comprising a first number of inverter elements; and
the startup oscillation frequency is generated by a startup oscillator comprises a second ring oscillator comprising a second number of inverter elements less than the first number of inverter elements.

14. The method as recited in claim 12, further comprising:
generating the second reference frequency using a reference oscillator that drives a first counter pre-loaded with a first value; and
generating the startup oscillation frequency using a startup oscillator that drives a second counter pre-loaded with a second value different than the first value.

15. The method as recited in claim 12, further comprising:
generating the first oscillation frequency using a propagation delay oscillator; and
generating the startup oscillation frequency using a startup oscillator, wherein the propagation delay oscillator and the startup oscillator share at least one inverter element.

16. The method as recited in claim 15, further comprising configuring a plurality of inverter elements into the startup oscillator during the startup interval and operable to configure the plurality of inverter elements into the propagation delay oscillator after the startup interval.

* * * * *